United States Patent
Koo et al.

(10) Patent No.: US 8,278,185 B2
(45) Date of Patent: Oct. 2, 2012

(54) METHOD FOR FORMING DEVICE ISOLATION LAYER OF SEMICONDUCTOR DEVICE AND NON-VOLATILE MEMORY DEVICE

(75) Inventors: Jae-Hyoung Koo, Gyeonggi-do (KR); Jin-Woong Kim, Gyeonggi-do (KR); Mi-Ri Lee, Gyeonggi-do (KR); Chi-Ho Kim, Gyeonggi-do (KR); Jin-Ho Bin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 8 days.

(21) Appl. No.: 12/473,307

(22) Filed: May 28, 2009

(65) Prior Publication Data

US 2010/0167496 A1    Jul. 1, 2010

(30) Foreign Application Priority Data

Dec. 26, 2008    (KR) .................. 10-2008-0134781

(51) Int. Cl.
    *H01L 21/76*    (2006.01)
(52) U.S. Cl. ............. 438/435; 438/296; 257/E21.549
(58) Field of Classification Search ........... 257/E21.555, 257/E21.549, E21.55, E21.551, E21.559, 257/21.551; 438/431, 435, 296, 437
    See application file for complete search history.

(56) References Cited

U.S. PATENT DOCUMENTS

| | | | | |
|---|---|---|---|---|
| 6,146,970 A * | 11/2000 | Witek et al. | .................... | 438/424 |
| 7,151,043 B2 * | 12/2006 | Kim et al. | .................... | 438/435 |
| 7,163,869 B2 * | 1/2007 | Kim et al. | .................... | 438/424 |
| 7,435,661 B2 * | 10/2008 | Miller et al. | .................... | 438/424 |
| 7,611,964 B2 * | 11/2009 | Cho et al. | .................... | 438/435 |
| 7,619,294 B1 * | 11/2009 | Gopinath et al. | .................... | 257/510 |
| 2003/0013272 A1 * | 1/2003 | Hong et al. | .................... | 438/437 |
| 2008/0081411 A1 * | 4/2008 | Cho et al. | .................... | 438/257 |
| 2009/0017596 A1 * | 1/2009 | Hanson et al. | .................... | 438/431 |
| 2009/0140320 A1 * | 6/2009 | Lee et al. | .................... | 257/321 |
| 2011/0001246 A1 * | 1/2011 | Furusawa et al. | .................... | 257/773 |

FOREIGN PATENT DOCUMENTS

| | | |
|---|---|---|
| KR | 1020020004729 | 1/2002 |
| KR | 1020030003542 | 1/2003 |
| KR | 1020040086193 | 10/2004 |
| KR | 1020080062582 | 7/2008 |

OTHER PUBLICATIONS

Notice of Preliminary Rejection issued from Korean Intellectual Property Office on Mar. 18, 2011.
Notice of Allowance issued by the Korean Intellectual Property Office on Feb. 6, 2012.

* cited by examiner

*Primary Examiner* — Caridad Everhart
(74) *Attorney, Agent, or Firm* — IP & T Group LLP

(57) ABSTRACT

A method for forming a device isolation layer of a semiconductor device or a non-volatile memory device is provided. A method for forming a device isolation layer of a semiconductor device includes: forming trenches having a first predetermined depth by etching a substrate; forming a first insulation layer having a second predetermined depth inside the trenches; forming a liner oxide layer having a predetermined thickness on internal walls of the trenches with the first insulation layer formed therein; and forming a second insulation layer for forming a device isolation layer over the substrate with the liner oxide layer formed therein, wherein the second insulation layer has a lower etch rate than that of the first insulation layer.

7 Claims, 6 Drawing Sheets

METHOD FOR FORMING DEVICE ISOLATION LAYER OF SEMICONDUCTOR DEVICE AND NON-VOLATILE MEMORY DEVICE

CROSS-REFERENCE TO RELATED APPLICATIONS

The present invention claims priority of Korean patent application number 10-2008-0134781, filed on Dec. 26, 2008, the disclosure of which is incorporated by reference herein in its entirety.

BACKGROUND OF THE INVENTION

The present invention relates to a method for fabricating a semiconductor device, and more particularly, to a method for forming a device isolation layer in a semiconductor device and a non-volatile memory device.

Semiconductor devices include a device isolation layer to electrically separate patterns from one another. A device isolation layer is generally formed through a shallow trench isolation process (STI).

The conventional STI process for forming a device isolation layer is performed as follows. First, a device isolation trench is formed by etching a substrate to a predetermined depth, and an insulation layer for forming a device isolation layer is formed over the substrate with the device isolation trench formed therein. Subsequently, a device isolation layer filling the substrate is formed by performing planarization until the substrate is exposed.

According to a conventional technology, an insulation layer is formed of a high density plasma (HDP) oxide to form a device isolation layer. Recently, however, there is a limitation in filling a device isolation trench with the HDP oxide due to the aspect ratio of the device isolation trench which is increasing according to the improvement in integrity of semiconductor devices.

To fill the device isolation trench without void, the conventional technology uses a flowable oxide to form the insulation layer for forming a device isolation layer. The flowable oxide is a material having a flowing property because it has a relatively low viscosity. A non-limiting example of the flowable oxide is perhydro-polysilazane (PSZ).

After filling the device isolation trench with the flowable oxide, a dense insulation layer for forming a device isolation layer may be formed through a thermal treatment. The thermal treatment eliminates gas components from the flowable oxide. To take an example, when a thermal treatment is performed after the formation of a PSZ layer, nitrogen or hydrogen inside the PSZ layer are ejected out in the form of $NH_3$ gas or $H_2$ gas. During the process, the chemical structure of the PSZ layer is changed into a $SiO_2$ layer. In short, a device isolation layer formed of Spin On Dielectric (SOD).

In this way, it is possible to fill the device isolation trench with the insulation layer for forming a device isolation layer without void, no matter how high aspect ratio the device isolation trench has.

However, according to the above-described conventional technology, since the density of the flowable oxide is decided according to how much gas is ejected during the thermal treatment, the multiple insulation layers for forming a device isolation layer have different density. This leads to uneven etch rate among the multiple insulation layers for forming a device isolation layer. Accordingly, an effective field oxide height (EFH) difference occurs among device isolation layers.

In a case where device isolation layers are formed of SOD by using a PSZ layer, moat may be formed during a process of removing a hard mask layer formed over a substrate due to its higher etch rate than a conventional HDP oxide layer.

Meanwhile, a non-volatile memory device retains data stored therein even through power supply is cut off. Non-volatile memory devices are divided into a charge storage-type non-volatile memory device and a charge trap-type non-volatile memory device according to how data are stored.

The charge storage-type non-volatile memory device stores charges in a floating gate electrode to store data, whereas the charge trap-type non-volatile memory device stores data by trapping charges in a charge trap layer. Therefore, the qualities of a tunnel dielectric layer, which is provided as an energy barrier during the tunneling of charges, and a charge storage layer (or a charge trap layer), which stores (or traps) charges, are important in a non-volatile memory device.

Conventional methods for forming a device isolation layer of a non-volatile memory device may damage a tunnel dielectric layer and/or a charge storage layer (or a charge trap layer) during the formation of the device isolation layer. Particularly, when a device isolation layer is formed of an HDP oxide layer, the tunnel dielectric layer and/or a charge storage layer (or a charge trap layer) may be damaged during a plasma process for forming the HDP oxide layer. As a result, the data retention characteristic of the memory device may be deteriorated.

SUMMARY OF THE INVENTION

Embodiments of the present invention devised to solve the above problems are directed to providing a method for forming a device isolation layer of a semiconductor device by using a first insulation layer for forming a device isolation layer and a second insulation layer for forming a device isolation layer, wherein the second insulation layer has a lower etch rate than the first insulation layer.

Embodiments of the present invention are also directed to providing a method for forming a device isolation layer of a non-volatile memory device by using a first insulation layer for forming a device isolation layer and a second insulation layer for forming a device isolation layer, wherein the second insulation layer has a lower etch rate than the first insulation layer.

In accordance with an aspect of the present invention, there is provided a method for forming a device isolation layer of a semiconductor device, including: forming trenches having a first predetermined depth by etching a substrate; forming a first insulation layer filed to a second predetermined depth inside the trenches; forming a liner oxide layer having a predetermined thickness over internal walls of the trenches with the first insulation layer formed therein; and forming a second insulation layer for forming a device isolation layer over the substrate with the liner oxide layer formed therein, wherein the second insulation layer has a lower etch rate than that of the first insulation layer.

In accordance with another aspect of the present invention, there is provided a method for forming a device isolation layer of a non-volatile memory device, including: forming a tunnel insulation layer, a charge storage layer, and a hard mask layer on a substrate; forming trenches having a first predetermined depth by etching the substrate, the hard mask layer, the charge storage layer, and the tunnel insulation layer; forming a first insulation layer having a second predetermined depth inside the trenches; and forming a liner oxide layer having a predetermined thickness on sidewalls of the hard mask layer exposed by the device isolation trench; and forming a second insulation layer over the resultant structure with the liner oxide layer formed therein, wherein the second insulation layer has a lower etch rate than that of the first insulation layer.

DESCRIPTION OF SPECIFIC EMBODIMENTS

Figure 1A:
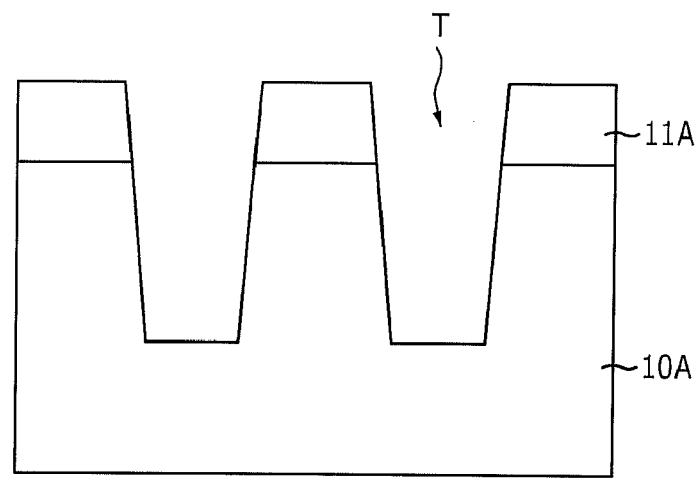
FIGS. 1A to 1E are cross-sectional views illustrating a method for forming a device isolation layer of a semiconductor device in accordance with a first embodiment of the present invention.

Other objects and advantages of the present invention can be understood by the following description, and become apparent with reference to the embodiments of the present invention. The thickness and gap are represented for the sake of convenience, and they may be exaggerated in comparison with actual dimensions. In this description of embodiments of the present invention, a structure of widely known technology not related to the points of the present invention may be omitted. The same reference numerals are given to the same elements, although they appear in different drawings.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

FIGS. 1A to 1E are cross-sectional views illustrating a method for forming a device isolation layer of a semiconductor device in accordance with a first embodiment of the present invention.

Referring to FIG. 1A, a hard mask layer 11 is formed over a substrate 10. The hard mask layer 11 may be an oxide layer, a nitrogen layer, or a stack structure of an oxide layer and a nitrogen layer.

Subsequently, trenches (T) are formed by etching the hard mask layer 11 and the substrate 10 to a predetermined depth. The etched hard mask layer and the etched substrate will be referred to as a hard mask layer pattern and substrate with reference numerals 11A and 10A, respectively, hereafter. Then, sidewall oxidation is performed to cure damages of the substrate 10A that have occurred during the formation of the trenches.

Figure 1B:
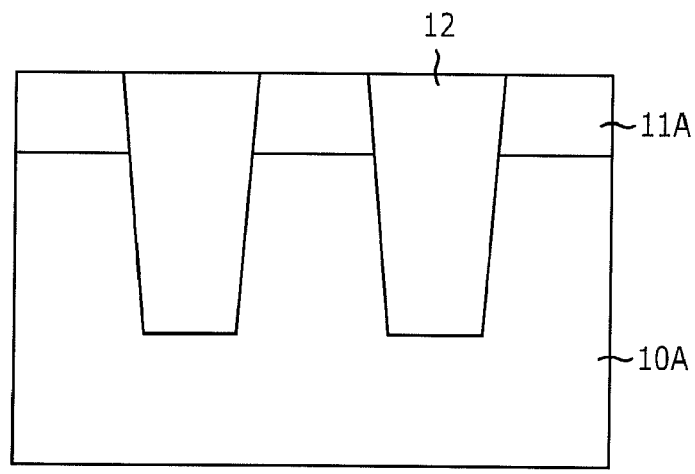

Referring to FIG. 1B, a flowable oxide layer is formed over the substrate with the trenches (T) formed therein. The flowable oxide layer is of a material having a flowing property due to relatively low viscosity, such as boron phosphorus silicate glass (BPSG), phosphorus silicate glass (PSG), or perhydropolysilazane (PSZ).

Subsequently, a first insulation layer 12 for forming a device isolation layer is formed by discharging gas out of the flowable oxide layer through a thermal treatment. For example, the first insulation layer 12 may be formed of Spin On Dielectric (SOD) by forming a flowable oxide layer of PSZ and performing a thermal treatment.

Subsequently, the first insulation layer 12 for forming a device isolation layer is planarized until the surface of the hard mask layer pattern 11A is exposed.

Figure 1C:
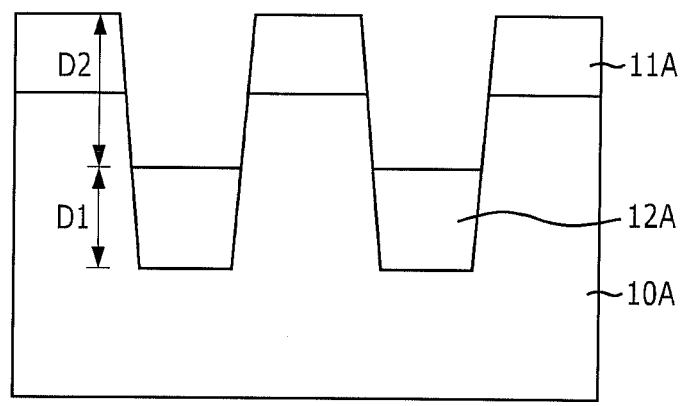

Referring to FIG. 1C, the first insulation layer 12 is removed by leaving a first insulation layer residue 12A in the trenches (T) in a first predetermined depth (D1). The first insulation layer 12 is removed through dry cleaning or wet dip-out process.

The first depth (D1) in which the first insulation layer residue 12A remain is determined in consideration of the formation of a second insulation layer for forming a device isolation layer. For example, the first depth (D1) may be determined based on a gap-fill characteristic of the second insulation layer. An open second depth (D2) is determined as a depth in which the second insulation layer can be deposited without void. In the first depth (D1), the first insulation layer residue 12A remains. Particularly, it is desirable to form the surface of the first insulation layer residue 12A to come beneath the surface of the substrate 10A.

As described above, although the first insulation layer residue 12A is formed of the flowable oxide layer, it is possible to have a uniform etch rate by decreasing the depth in which the first insulation layer residue 12A fills because gas ejection becomes easy. Also, it becomes easy to control the EFH of a device isolation layer.

Figure 1D:
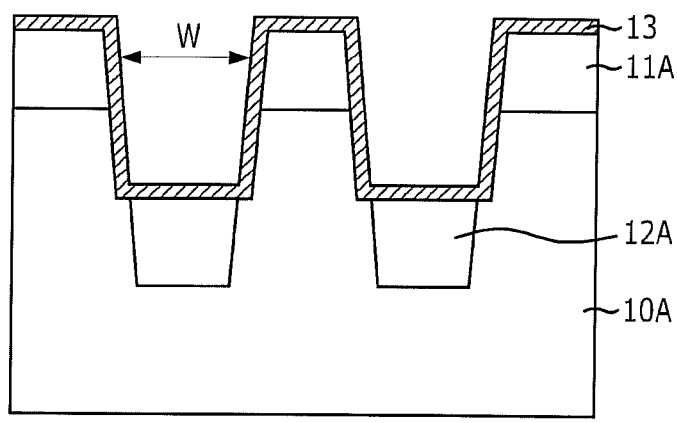

Referring to FIG. 1D, a liner oxide layer 13 is formed over the resultant structure. Herein, the liner oxide layer 13 may be also formed by oxidizing the sidewall of the hard mask layer 11A exposed by the internal wall of the trenches (T) or oxidizing the sidewalls of the substrate 10A and hard mask layer 11A according to the first depth (D1) where the first insulation layer residue 12A remains.

Herein, the liner oxide layer 13 may be formed through a radical oxidation process at a temperature higher than approximately 700° C. or through a plasma oxidation process at a temperature ranging from approximately 400° C. to approximately 900° C.

When the plasma oxidation process is performed, plasma may be generated from direct current (DC) discharge, radio frequency (RF) discharge, or microwave discharge. For example, in case of RF discharge, used frequency may range from approximately 10 MHz to approximately 15 MHz. Specifically, frequency of 13.56 MHz may be used. Also, in case of microwave discharge, used frequency may range from approximately 1.5 MHz to approximately 3.5 MHz. Specifically, frequency of 2.45 MHz may be used.

Also, when the plasma oxidation process is performed, argon gas or oxygen gas may be used. Addition of hydrogen gas may increase the growth rate of the liner oxide layer 13.

The liner oxide layer 13 may be formed in a thickness ranging from approximately 20 Å to approximately 150 Å.

When the liner oxide layer 13 is formed by oxidizing the internal wall of the trenches (T), gap-fill margin may be acquired as a silicon component is oxidized and thereby the width (W) of the opening portions of the trenches (T) is increased. Also, it is possible to prevent adjacent layers from being damaged when the second insulation layer is formed later on.

Figure 1E:
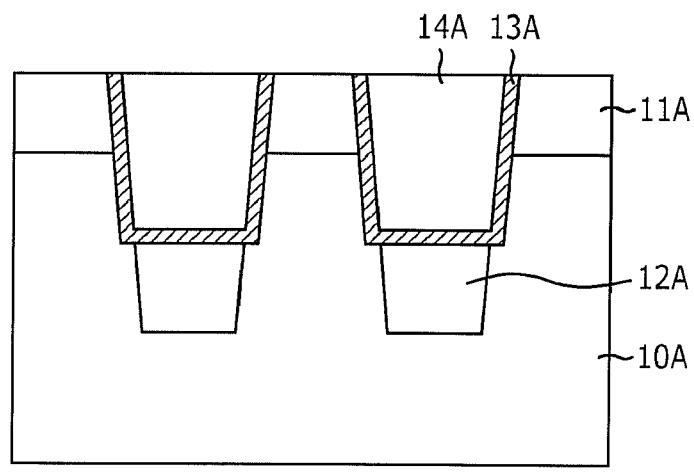

Referring to FIG. 1E, the second insulation layer 14 is formed over the resultant structure with the liner oxide layer 13 formed therein. The second insulation layer 14 has a lower etch rate than the first insulation layer residue 12A.

Since the second insulation layer 14 is formed of a material having a lower etch rate than the first insulation layer residue 12A, it is possible to prevent moat from being formed during a subsequent process of removing the hard mask layer 11A.

Moreover, since a plurality of device isolation layers have uniform etch rate, it is easy to adjust the EFH of the device isolation layers.

The second insulation layer 14 may be formed of HDP oxide, which has low etch rate, does not form moat, and adjust the EFH easily.

When an HDP oxide layer is formed through the plasma oxidation process, adjacent layers may be damaged. However, the presence of the liner oxide layer 13 can protect the adjacent layers from being damaged. Also, although the gap-fill characteristic of the second insulation layer 14 is not as excellent as that of the first insulation layer residue 12A, the second insulation layer 14 fills trenches (T) having a relatively low aspect ratio because it fills remaining regions of the trenches (T) after the formation of the first insulation layer residue 12A. Therefore, void does not occur.

Subsequently, the second insulation layer 14 is planarized until the surface of the hard mask layer pattern 11A is exposed. During the planarization process, the liner oxide layer 13 is also etched until the surface of the hard mask layer pattern 11A is exposed. The etched liner oxide layer will be given with a reference numeral 13A. In this way, a device isolation layer including the first insulation layer residue 12A and the second insulation layer pattern 14A is formed.

FIGS. 2A to 2F are cross-sectional views illustrating a method for forming a device isolation layer of a non-volatile memory device in accordance with a second embodiment of the present invention. Specific processes for forming a device isolation layer are the same as those described with reference to FIGS. 1A and 1E.

Figure 2A:
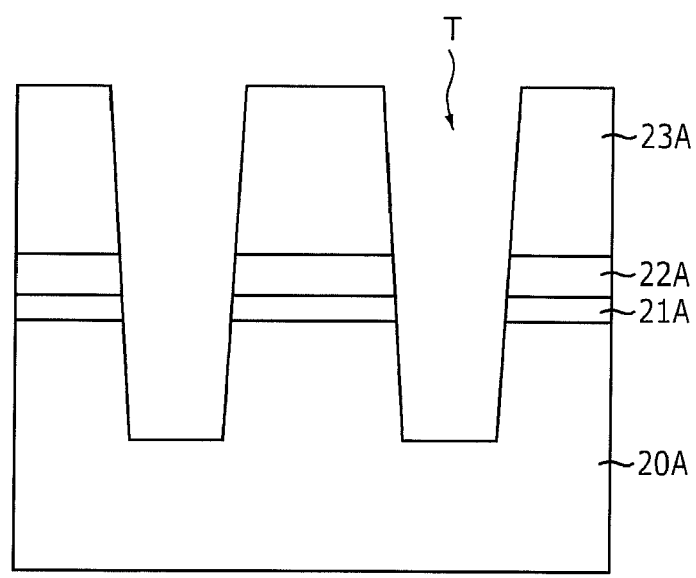
FIGS. 2A to 2F are cross-sectional views illustrating a method for forming a device isolation layer of a non-volatile memory device in accordance with a second embodiment of the present invention.

Referring to FIG. 2A, a tunnel insulation layer 21, a charge storage layer 22, and a hard mask layer 23 are sequentially formed over a substrate 20.

Herein, the charge storage layer 22 may be a charge storage layer or a charge trap layer according to a data storing method of a non-volatile memory device. Also, the hard mask layer 23 may be a buffer oxide layer, a nitrogen layer, or a stack structure of a buffer oxide layer and a nitrogen layer.

Subsequently, the hard mask layer 23, the charge storage layer 22, the tunnel insulation layer 21, and the substrate 20 are etched to a predetermined depth to thereby form trenches (T), and then sidewall oxidation process is performed.

Figure 2B:
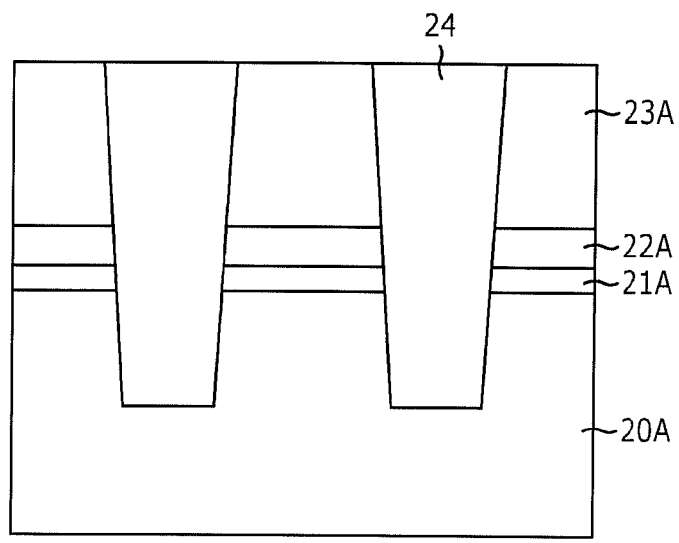

Referring to FIG. 2B, a first insulation layer 24 for forming a device isolation layer is formed by forming a flowable oxide layer over the resultant structure with the trenches (T) formed therein and performing a thermal treatment.

Figure 2C:
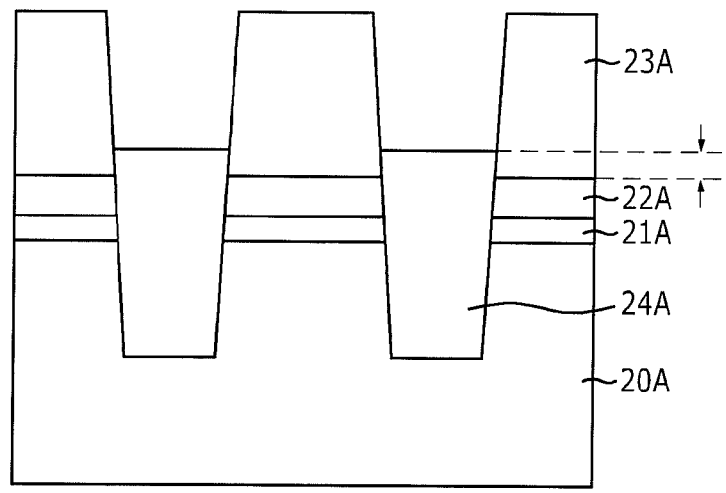

Subsequently, the first insulation layer 24 is planarized until the surface of the hard mask layer pattern 23A is exposed. As shown in FIG. 2C, the first insulation layer is removed while leaving a first insulation layer residue 24A in the trenches (T) to a predetermined depth.

The first depth in which the first insulation layer residue 24A remains is determined in consideration of the formation of a second insulation layer for forming a device isolation layer. According to the embodiment of the present invention, the first insulation layer residue 24A remains in a depth that the surface of the first insulation layer residue 24A comes higher than the surface of the charge storage layer pattern 22A as shown by the arrows in FIG. 2C. This resultant structure can protect the charge storage layer pattern 22A from being damaged when a second insulation layer for forming a device isolation layer is formed subsequently.

Figure 2D:
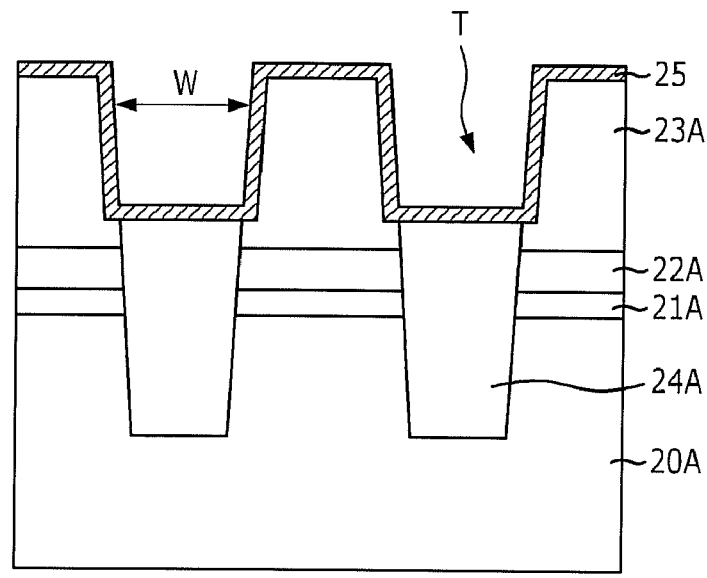

Since the charge storage layer pattern 22A can be also protected from being damaged by the presence of a liner oxide layer 25 shown in FIG. 2D, which will be formed in a subsequent process, the first insulation layer residue 24A may remain with its surface lower than that of the substrate 20A.

Referring to FIG. 2D, the liner oxide layer 25 is formed over the resultant structure with the trenches (T). The liner oxide layer 25 may be formed by oxidizing the hard mask layer 23 and first insulation layer residue 24A.

When the liner oxide layer 25 is formed by oxidizing the internal wall of the trenches (T) and the sidewalls of the hard mask layer pattern 23A exposed by the trenches (T), the width (W) of opening portions of the trenches (T) is increased to thereby acquire gap-fill margin and to protect the tunnel insulation layer pattern 21A and the charge storage layer pattern 22A from being damaged during a subsequent process of forming a second insulation layer.

Figure 2E:
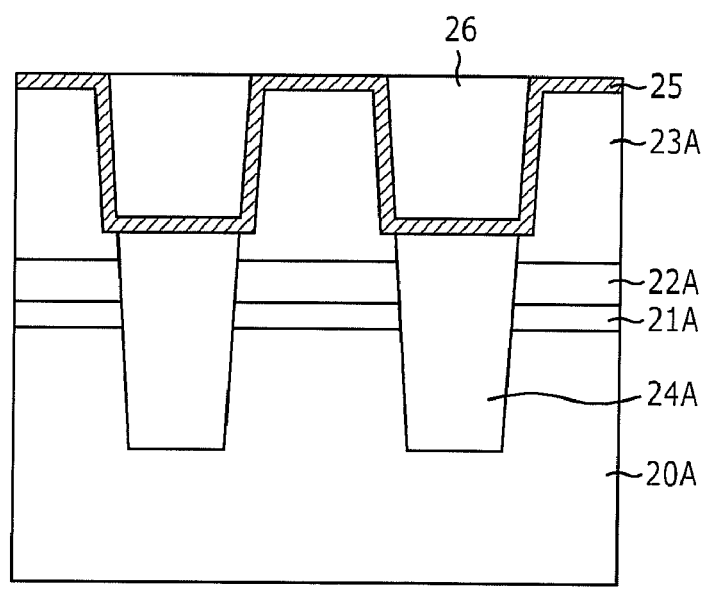

Referring to FIG. 2E, a second insulation layer 26 for forming a device isolation layer is formed over the resultant structure with the liner oxide layer 25. The second insulation layer 26 has a lower etch rate than the first insulation layer residue 24A.

When the second insulation layer 26 is formed of a material having a lower etch rate than the first insulation layer residue 24A, it is possible to prevent moat from being formed and to control the EFH of a device isolation layer easily.

Subsequently, the second insulation layer 26 is planarized until the surface of the hard mask layer pattern 23A is exposed. The planarized second insulation layer is given with a reference numeral 26A. During the planarization process, the liner oxide layer 25, too, is etched until the surface of the hard mask layer pattern 23A is exposed to thereby form an etched liner oxide layer 25A. In this way, a device isolation layer including the first insulation layer residue 24A and the planarized second insulation layer 26A.

Figure 2F:
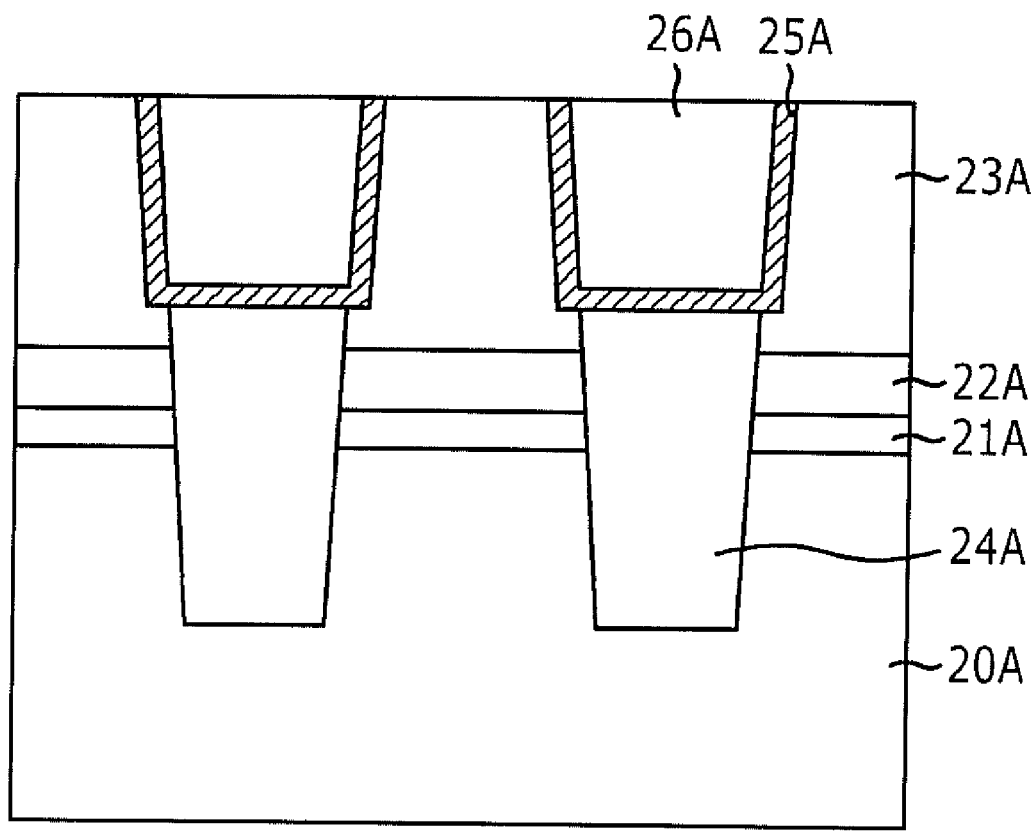

Referring to FIG. 2F, the hard mask layer pattern 23A is removed through a strip process. For example, when the hard mask layer pattern 23A is of a stack structure of a buffer oxide layer and a nitrogen layer, the nitrogen layer may be removed using phosphoric acid, and the buffer oxide layer may be removed using a buffered oxide etchant (BOE) or hydrofluoric acid (HF).

According to embodiments of the present invention, since the first insulation layer for forming a device isolation layer has a higher etch rate than the second insulation layer for forming a device isolation layer, it is possible to prevent moat from being formed and easily control the effective field oxide height (EFH) of the device isolation layers.

In particular, an internal wall of a device isolation layer is oxidized to thereby form a linear oxide layer. The linear oxide layer secures margins for forming the second insulation layer for forming a device isolation layer and prevents adjacent layers from being damaged.

Likewise, a device isolation layer for a non-volatile memory device may be formed using a first insulation layer for forming a device isolation layer and a second insulation layer for forming a device isolation layer, where the first insulation layer has a higher etch rate than the second insulation layer. In particular, a sidewall of a hard mask layer exposed by a device isolation trench may be oxidized to thereby form a linear oxide layer. The linear oxide prevents a tunnel dielectric layer (or a charge trap layer) from being damaged to thereby improve the characteristics of the memory device.

While the present invention has been described with respect to the specific embodiments, it will be apparent to those skilled in the art that various changes and modifications may be made without departing from the spirit and scope of the invention as defined in the following claims.

What is claimed is:

1. A method for forming a device isolation layer of a non-volatile memory device, comprising:

forming a tunnel insulation layer, a charge storage layer, and a hard mask layer over a substrate;

forming trenches having a first depth by etching the hard mask layer, the charge storage layer, the tunnel insulation layer, and the substrate;

forming a first insulation layer having a second depth inside the trenches; and forming a liner oxide layer having a given thickness on internal walls of the trenches, which are not covered by the first insulation layer, and on a surface of the first insulation layer through an oxidation process of the hard mask; and forming a second insulation layer over the liner oxide layer, wherein the second insulation layer has a lower etch rate than that of the first insulation layer.

2. The method of claim 1, wherein the forming of the first insulation layer includes:

forming a flowable oxide layer over the hard mask layer with the trenches;

forming the first insulation layer by performing a thermal treatment;

planarizing the first insulation layer until a surface of the hard mask layer is exposed; and removing the first insulation layer while leaving the first insulation layer in the second depth inside the trenches.

3. The method of claim 1, wherein the forming of the liner oxide layer includes:

oxidizing internal walls of the trenches with the first insulation layer to form the liner oxide layer.

4. The method of claim 1, wherein a surface of the first insulation layer is lower than a surface of the hard mask layer.

5. The method of claim 1, wherein the predetermined thickness of the liner oxide layer is a thickness ranging from approximately 20 Å to approximately 150 Å.

6. The method of claim 1, wherein the first insulation layer is an SOD layer formed of PSZ, and the second insulation layer is formed of HDP oxide.

7. The method of claim 1, further comprising:

planarizing the second insulation layer until a surface of the hard mask layer is exposed after the forming of the second insulation layer; and removing the hard mask layer.

* * * * *